(12) United States Patent
Smooha

(10) Patent No.: US 7,569,445 B2
(45) Date of Patent: Aug. 4, 2009

(54) SEMICONDUCTOR DEVICE WITH CONSTRICTED CURRENT PASSAGE

(75) Inventor: Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/872,347

(22) Filed: Oct. 15, 2007

(65) Prior Publication Data

US 2008/0032479 A1 Feb. 7, 2008

Related U.S. Application Data

(62) Division of application No. 10/404,832, filed on Apr. 1, 2003, now Pat. No. 7,329,926.

(51) Int. Cl.
*H01L 21/336* (2006.01)

(52) U.S. Cl. .............. 438/197; 438/178; 438/199; 438/202; 438/217; 438/218; 438/230; 438/257; 257/E21.638; 257/E21.696

(58) Field of Classification Search ................. 438/178, 438/280
See application file for complete search history.

(56) References Cited

U.S. PATENT DOCUMENTS

| 4,806,999 | A | 2/1989 | Strauss |
| 4,821,089 | A | 4/1989 | Strauss |
| 4,990,802 | A | 2/1991 | Smooha |
| 5,838,033 | A | 11/1998 | Smooha |
| 5,888,861 | A * | 3/1999 | Chien et al. .............. 438/202 |
| 6,566,710 | B1 | 5/2003 | Strachan et al. |
| 6,730,967 | B2 * | 5/2004 | Lin ........................ 257/355 |
| 2002/0076876 | A1 | 6/2002 | Ker et al. |
| 2004/0195634 | A1 | 10/2004 | Smooha |

* cited by examiner

*Primary Examiner*—N Drew Richards
*Assistant Examiner*—Kyoung Lee

(57) ABSTRACT

A semiconductor device including a gate located over a semiconductor substrate and a source/drain region located adjacent the gate. The source/drain region is bounded by an isolation structure that includes a constricted current passage between the gate and the source/drain region.

8 Claims, 5 Drawing Sheets

SEMICONDUCTOR DEVICE WITH CONSTRICTED CURRENT PASSAGE

This Application is a Divisional of prior application Ser. No. 10/404,832 filed on Apr. 1, 2003, now U.S. Pat. No. 7,329,926 currently allowed, to Yehuda Smooha, et al. The above-listed Application is commonly assigned with the present invention and is incorporated herein by reference as if reproduced herein in its entirety under Rule 1.53(b)

TECHNICAL FIELD OF THE INVENTION

The present invention is directed, in general, to a semiconductor device and, more specifically, to a semiconductor device having a constricted current passage in a source/drain region that provides improved electrostatic discharge protection for an integrated circuit.

BACKGROUND OF THE INVENTION

Those skilled in the art recognize that output buffers of metal oxide semiconductor (MOS) integrated circuits are susceptible to damage from electrostatic discharge (ESD). ESD events are typically conducted to the integrated circuit through the output bond pads which connect the integrated circuit to external package terminals. The integrated circuits may be exposed to ESD events before the packaging operation, but more typically are exposed to ESD events after packaging, such as during shipping or handling operations.

Those skilled in the art understand that when MOS devices are coupled between a bond pad an input to a circuit that experiences an ESD event, the MOS devices can operate as bipolar transistors in a snap-back mode. Moreover, conventional MOS device layouts often include multiple fingers of similar or identical devices, wherein each finger is associated with a commonly formed channel. When such MOS devices experience an ESD event, the snap-back operation is limited to the devices in only one of the fingers of similar MOS devices. Accordingly, the excessive charge on these MOS devices causes the devices to fail at an undesirably low stress level. Furthermore, the MOS devices of many conventional configurations are isolated from adjacent devices formed in the same finger, such that the ESD event is isolated to a limited number of devices along a single finger or channel. This isolation also creates non-uniformity of the ESD effect among all of the MOS devices, rendering those devices most affected more susceptible to failing at a low level of stress.

The design techniques used to protect output buffers from ESD include the use of output resistors and/or voltage clamping devices such as diodes or transistors. These devices serve to limit the maximum voltage that can appear at the drain electrode of one or more output transistors. Such conventional clamping devices are disclosed in U.S. Pat. Nos. 4,821, 089, 4,806,999 and 4,990,802. However, these clamping devices do not provide an adequate amount of protection and can undesirably decrease switching rates. Moreover, the integration of the clamping devices requires additional processing steps and results in larger devices.

Another approach is disclosed in U.S. Pat. No. 5,838,033, which describes a resistor formed in the tub region adjacent the drain electrode. However, as with the clamping devices discussed above, this "diffused resistor" also requires additional processing steps and consumes additional surface area on the substrate.

Accordingly, what is needed in the art is a device and method of manufacture thereof that is easily integrated into existing processing procedures and that overcomes the above-described disadvantages of the prior art.

SUMMARY OF THE INVENTION

To address the above-discussed deficiencies of the prior art, the present invention provides a semiconductor device that includes a gate located over a semiconductor substrate and a source/drain region located adjacent the gate. The source/drain region is bounded by an isolation structure that includes a constricted current passage between the gate and the source/drain region.

The foregoing has outlined an embodiment of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
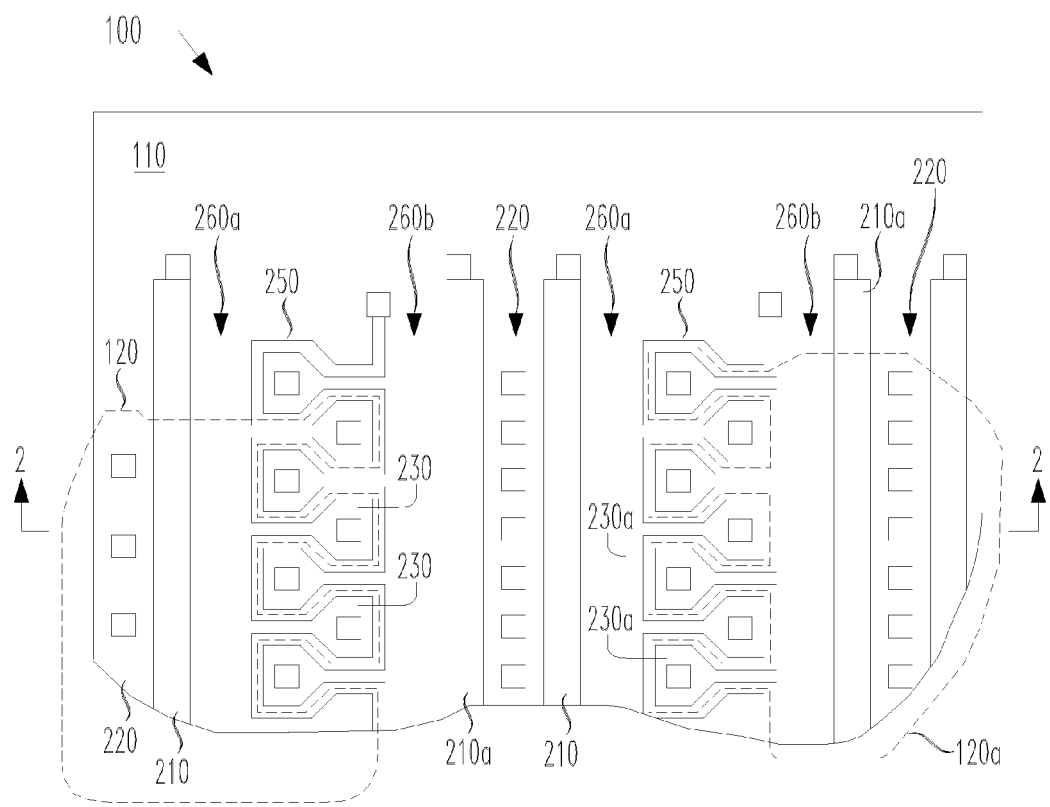
FIG. 1 illustrates a plan view of an embodiment of an integrated circuit device constructed according to the principles of the present invention.

Referring initially to FIG. 1, illustrated is a plan view of an embodiment of an integrated circuit device 100 constructed according to the principles of the present invention. The integrated circuit device 100 includes a semiconductor substrate 110 and plurality of semiconductor devices 120 formed thereon (portions of each of the semiconductor devices 120 being indicated by dashed lines in FIG. 1). In one embodiment, one or more of the plurality of semiconductor devices 120 may be an embodiment of a metal-oxide semiconductor field effect transistor (MOSFET) As discussed above, MOSFET transistors are conventionally employed as output transistors for integrated circuit devices.

Figure 2:
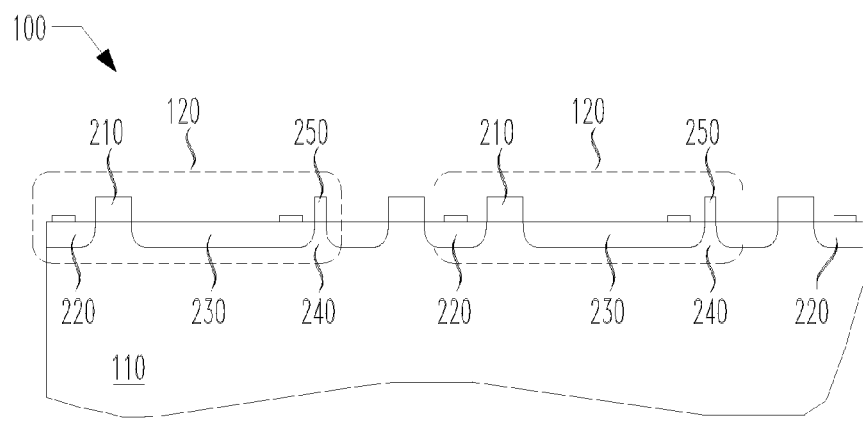
FIG. 2 illustrates a sectional view of the integrated circuit device shown in FIG. 1.

Turning to FIG. 2 with continued reference to FIG. 1, illustrated is a sectional view of the integrated circuit device 100 shown in FIG. 1 as taken through the section line 2-2. In the embodiment shown in FIG. 2, the semiconductor devices 120 each include a gate 210, a source region 220, a plurality of drain regions 230, and an isolation structure 240. Those skilled in the art will understand that the source region 220 and drain regions 230 may be interchanged in some embodiments depending on the mode of operation. However, in some embodiments, such an interchange may not be desirable. Nevertheless, the source and drain regions (220, 230) may each be generally referred to as a source/drain region. However, for the sake of simplicity, specific reference to either the source region 220 or the drain regions 230 will be used hereafter.

The isolation structure 240 is formed in the substrate 110 primarily underneath a mask 250. The formation of an embodiment of the isolation structure 240 and the mask 250 will be described in detail below.

Figure 3:
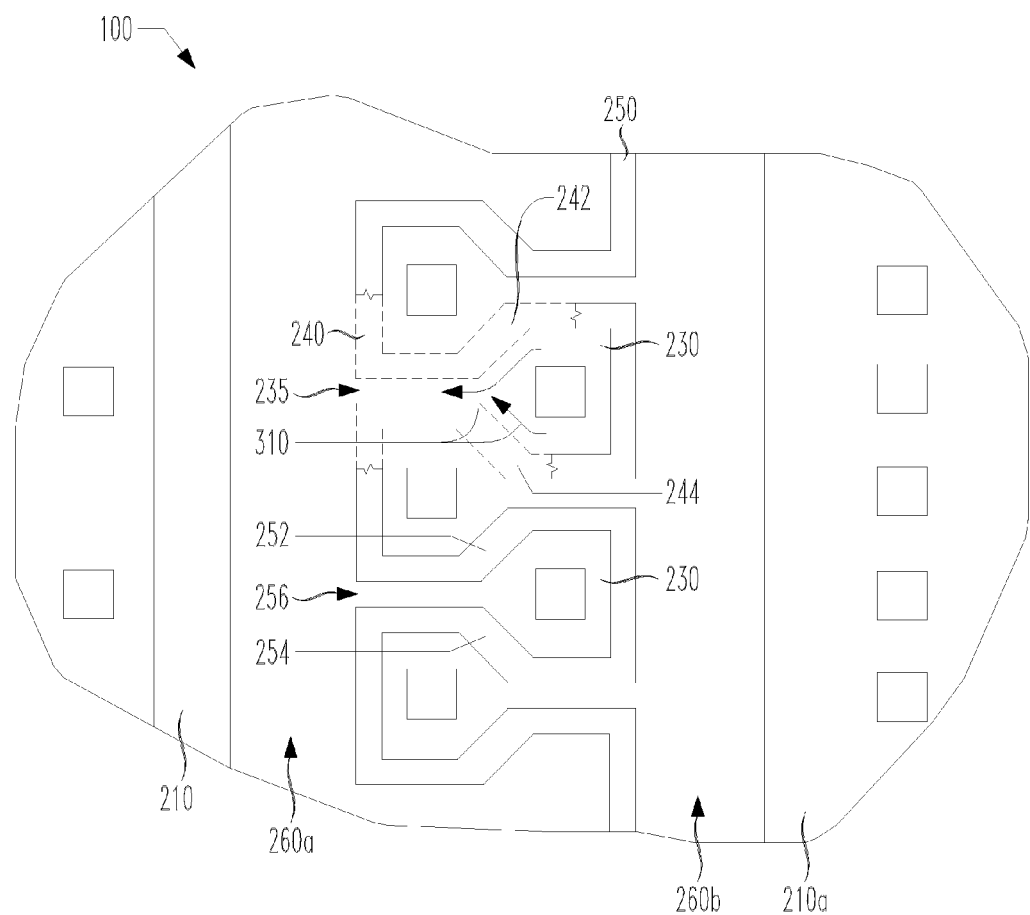
FIG. 3 illustrates a plan view of a portion of the integrated circuit device shown in FIG. 1.

Turning now to FIG. 3 with continued reference to FIG. 2, illustrated is a plan view of a portion of the integrated circuit device 100 shown in FIG. 1. In the illustrated embodiment, the mask 250 includes a plurality of paired, opposing portions 252 and 254 that form a corresponding plurality of narrowed openings 256. Because the isolation structure 240 lies primarily underneath the mask 250, the isolation structure 240 includes portions each having a similar or substantially identical contour as corresponding mask portions 252 and 254 for each semiconductor device 120. For example, the isolation structure 240 shown in FIG. 3 includes first portions 242 substantially underlying the mask portions 252 and second portions 244 substantially underlying the mask portions 254. (Portions of the mask 250 are not shown in FIG. 3 so that the underlying portions of the isolation structure 240 may be more clearly shown.) Each of the paired, opposing portions 242 and 244 of the isolation structure 240 form a constricted current passage 235 in one of the drain regions 230. Thus, in the embodiment shown in FIG. 3, each semiconductor device 120 includes a plurality of constructed current passages 235 each substantially underlying a narrowed opening 256 in the mask 250. Moreover, as also shown in FIG. 3, each drain region 230 is bounded by the isolation structure 240, including the isolation structure portions 242, 244.

Upon the occurrence of an electrostatic discharge (ESD) event, an electrical current, as indicated by arrows 310, will develop from a drain 230 towards the gate 210. However, the isolation structure 240 is not electrically conductive, or it is at least substantially less conductive than the drain regions 230. For example, as in embodiments discussed below, the isolation structure 240 may comprise a dielectric and the drain regions 230 may be at least semi-conductive, or the isolation structure 240 and drain regions 230 may have contrasting doping profiles. Accordingly, the electrical current between the drain regions 230 and the gate 210 resulting from an ESD event may be confined by the isolation structure 240, such that current substantially escapes the isolation structure 240 through the constricted current passage 235.

The geometry of the constricted current passage 235 substantially limits the current that may pass therethrough. For example, in one embodiment, the constricted current passage 235 is configured to have a resistance of about 100 ohms. In other embodiments the constricted current passage 235 may be configured to have a resistance ranging between about 50 ohms and about 200 ohms, although other resistance values are within the scope of the present invention. Thus, resistance may be altered during the design stage by adjusting the length and/or width of the constricted current passage 235 without requiring additional process steps. By limiting the current that may pass from each drain region 230 to the gate 210, the semiconductor device 120 will be better protected from ESD damage.

Returning to FIG. 1, an additional semiconductor device 120a is also indicated by dashed lines. This semiconductor device 120a is a mirror image of the semiconductor device 120 described above. For example, the semiconductor device 120a includes a source region 220, a gate 210a, and drain regions 230a. By configuring the mask 250 to have a serpentine shape, such as that shown in FIGS. 1 and 3, the semiconductor device 120 and the mirror-image semiconductor device 120a may be configured in an interwoven manner.

In the embodiments shown in FIGS. 1-3, the region defined between the gates 210, 210a is not completely occupied by the isolation structure 240 and plurality of drain regions 230, 230a. For example, the region also includes a first common region 260a and a second common region 260b. The common regions 260a, 260b provide a larger region over which an ESD event may disperse before affecting the corresponding gate 210, 210a. Accordingly, the undesirable current and/or voltage arising from an ESD event may be further reduced before affecting the gates 210, 210a. It should be noted, however, that the configuration of the mask 250 and isolation structure 240 is not limited to the particular serpentine shape shown in FIGS. 1 and 3. That is, those skilled in the art will understand that the isolation structure 240 and mask 250 may not be serpentine or even continuous. For example, the opposing portions 242 and 244 of the isolation structure 240 and the opposing portions 252 and 254 of the mask 250 may be discrete portions spanning the entire width between adjacent gates 210, 210a.

As discussed above, conventional MOSFET devices can behave like bipolar devices during ESD discharge events. However, conventional MOSFET layout configurations prohibit more than one device (or a small group of devices) from experiencing the ESD event. Accordingly, the robustness of the MOSFET will depend on the width of that particular device or group of devices because once a device goes into bipolar action the voltage will drop, such that adjacent devices may not have a chance to also convert to bipolar action and experience the ESD event. However, by configuring the drain regions 230 to include the resistance caused by the constricted current passages 235 (FIG. 3), the semiconductor device 120 will exhibit a current-voltage behavior leading through the breakdown voltage such that adjacent devices may also exhibit bipolar behavior. Basically, the resistance in the drain regions 230 provides a means to encourage multiple fingers to cooperate in the ESD event. Accordingly, the robustness of the devices will not depend only on the width of just a few devices but may advantageously depend on multiple devices.

In addition, if a single semiconductor device 120 is considered, it is well known that drain resistance will help in making the bipolar action more homogeneous along the channel (the region in the substrate 110 underneath the gates 210). Without this so-called "ballast" resistance, the ESD event may travel through only one narrow part of the device 120, causing the device 120 to fail.

Thus, the resistance of the constricted current passages 235 in the drains 230 allows multiple adjacent devices 120, 120a to participate in the ESD event, and also causes the ESD event to be more homogeneous and uniform. By normalizing the degree of ESD among adjacent devices 120, 120a along a common region, any heating effect localized to one device 120, 120a (or smaller group of devices 120, 120a than illustrated) may be minimized, thereby reducing thermal runaway and localized failures.

Figure 4:
FIGS. 4-8 illustrate sectional views of an embodiment of a semiconductor device during sequential stages of manufacture according to the principles of the present invention.

An embodiment of a method for manufacturing a semiconductor device such as the semiconductor device 120 shown in FIGS. 1-3 will now be described. Turning to FIG. 4, illustrated is a sectional view of an embodiment of a semiconductor device 400 in an initial stage of manufacture according to the principles of the present invention. As shown in FIG. 4, a semiconductor substrate 410 is provided with a conventionally doped tub or well 415 formed therein and a conventional gate oxide layer 420 formed thereover. A conventional gate material layer 430 is formed over the oxide layer 420. The gate material layer 430 may be of conventional composition and manufacture, such as a layer of deposited polysilicon.

While the gate material layer 430 is illustrated as being deposited directly on (i.e., in contact with) the oxide layer 420 and, thus, over but not directly on the semiconductor substrate 410, those skilled in the art will understand that the oxide layer 420 may not be desired, or that alternative or additional layers (not shown) may be formed between the gate material layer 430 and the semiconductor substrate 410. Likewise, portions of the gate material layer 430 may be formed directly on the semiconductor substrate 410. Accordingly, by referring to the gate material layer 430 as being formed over the semiconductor substrate 410, the term "over" is intended to include those embodiments in which the gate material layer 430 is formed directly on and in contact with the semiconductor substrate 410, or those embodiments in which one or more layers (such as the oxide layer 420) may be formed between the gate material layer 430 and the semiconductor substrate 410.

Figure 5:
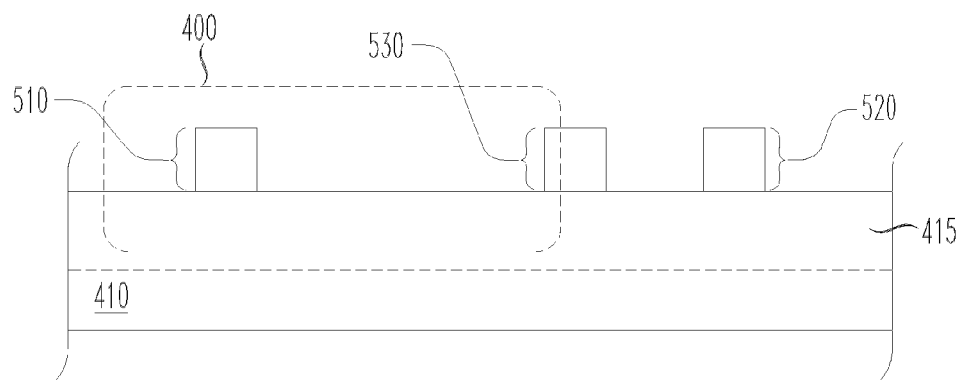

Turning to FIG. 5, illustrated is a sectional view of the semiconductor device 400 shown in FIG. 4 after the gate material layer 430 and oxide layer 420 have been patterned to form a first gate 510, a second gate 520 and a mask 530. The first gate 510 may be at least similar to the gate 210 shown in FIGS. 1-3, the second gate 520 may be at least similar to the gate 210 or 210a, and the mask 530 may be at least similar to the mask 250. The region comprising a particular semiconductor device 400 is indicated in FIG. 5 by dashed lines.

The gate material layer 430 and the oxide layer 420 may be patterned by conventional processes, except that the shape of the mask 530 is configured to have a contour similar or identical to the mask 250 shown in FIGS. 1-3. Of course, as discussed above, those skilled in the art will recognize that the mask 530 may have other contours. That is, while the serpentine contour of the mask 250 shown in FIGS. 1-3 may be advantageous in some embodiments, other embodiments will call for a less periodic contour, or a contour in which the mask 530 spans the entire distance between the adjacent gates 510 and 520. In some embodiments (not shown), the mask 530 may not even be one contiguous feature, consisting instead of multiple discrete segments spanning between adjacent gates 510 and 520. However, the mask 530 should include a pair of opposing portions (such as portions 252 and 254 shown in FIG. 3) for each semiconductor device.

Figure 6:
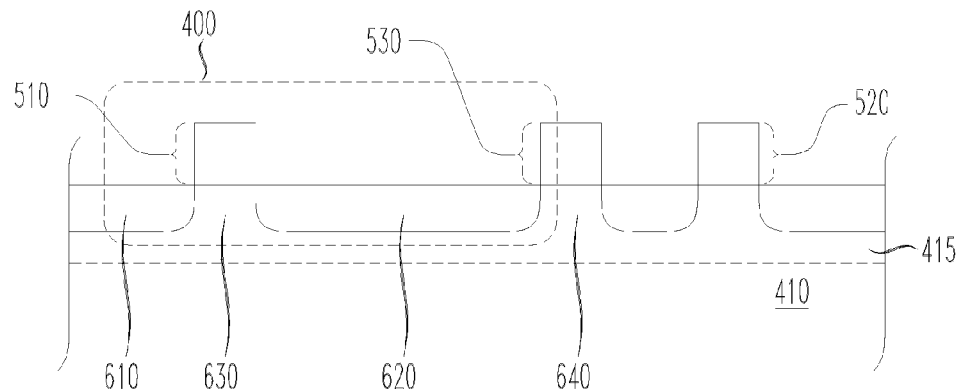

Turning now to FIG. 6, illustrated is a sectional view of the semiconductor device 400 shown in FIG. 5 after an implant step has been performed to form a source region 610 and a drain region 620. If the tub or well 415 is p-doped, such as when the semiconductor device is an n-MOSFET, then the source region 610 and drain region 620 are n-doped. However, the semiconductor device 400 may also be an p-MOSFET, wherein the source region 610 and drain region 620 are p-doped.

During the implant step, the gate 510 blocks ion implantation into the tub or well 415 in a region substantially thereunder, such that a channel region 630 is formed between the source region 610 and drain region 620. Similarly, the mask 530 blocks ion implantation into the semiconductor substrate 410 in a region substantially thereunder, thereby forming an isolation structure 640. The channel region 630 and the isolation structure 640 are less conductive than the surrounding areas of the substrate 410 because the channel region 630 and the isolation structure 640 have a dopant concentration opposite that of the substrate 410. For example, if the source region 610 or drain region 620 is doped with an n-type dopant, the area under the isolation structure 640 will have a dopant profile and concentration the same as the tub or well 415, for example a p-type dopant, in which the source region 610 or drain region 620 is formed. Moreover, the isolation structure 640 has a geometric contour that is substantially similar or identical to the mask 530, such that the isolation structure 640 may also have a serpentine contour (as with the mask 250 and isolation structure 240 shown in FIGS. 1 and 3).

Figure 7:
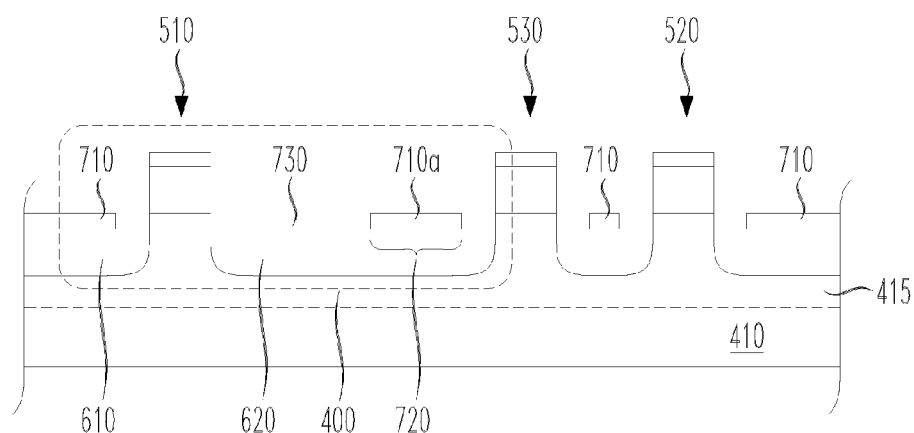

Turning to FIG. 7, illustrated is a sectional view of the semiconductor device 400 shown in FIG. 6 after a silicide layer 710 has been conventionally formed over the source region 610, the gate 510 and the mask 530. In the particular embodiment shown, however, conventional masking or other lithographic techniques may be employed to substantially block formation of the silicide layer 710 over the drain region 620. Accordingly, a small portion of the silicide layer 710a corresponding to a contact window region 720 of the drain region 620 may be formed over the drain region 620. Accordingly, a substantial portion 730 of the drain region 620 may remain exposed to subsequent processing. Those skilled in the art understand that the contact window region 720 may correspond to a conventional contact/via to be subsequently formed thereover.

By leaving a substantial portion of the drain region 620 exposed, the resistance of the drain region 620 may be substantially increased, which can be advantageous in some embodiments, as discussed above. However, in some embodiments, it may be desirable to form the silicide layer 710 over a more substantial portion of the drain region 620, or to cover the drain region 620 entirely. Those skilled in the art understand that configuring the drain region 620 to have excessively high resistance can deteriorate the switching rate and other performance characteristics of MOSFETs and other semiconductor devices. Accordingly, the amount of silicide coverage of the drain region 620 may require an application-specific determination.

Figure 8:
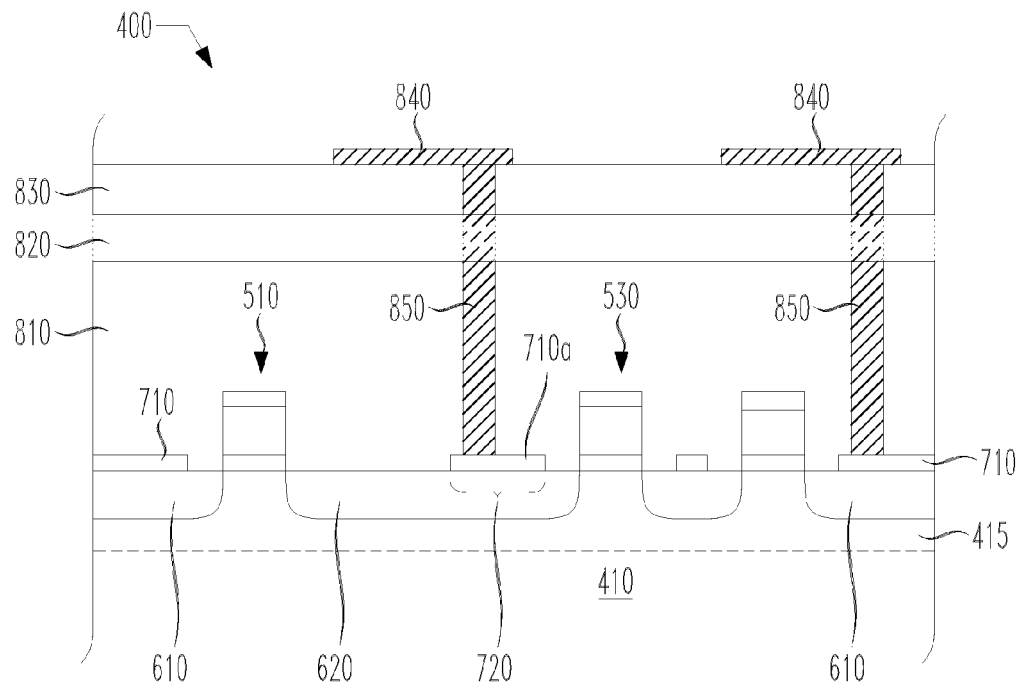

Turning to FIG. 8, illustrated is a sectional view of an embodiment of the semiconductor device 400 shown in FIG. 7 in a substantially completed stage of manufacture according to the principles of the present invention. A conventional dielectric layer 810 is formed over the silicide layers 710 and 720 and the drain region 620. Additional dielectric layers and/or conductive interconnect layers may be conventionally formed over the dielectric layer 810, as generally indicated by the layer 820 in FIG. 8. A dielectric or passivation layer 830 may be formed on the layer stack 820, and a plurality of bond pads 840 may be formed thereover. In the particular embodiment shown in FIG. 8, at least one of the bond pads 840 is electrically coupled to the source region 610 or drain region 620 through the silicide layer 710 or 720, respectively, by a conventional via 850 or other interconnect.

Several of the advantages of the present invention have already been described above. Another advantage is that the isolation structure of the present invention may be integrated into existing semiconductor device manufacturing processes without adding any additional process steps. For example, the serpentine-shaped mask may be formed by the same steps required in existing processes to form the gates of the semiconductor devices. Similarly, the implant step employed by conventional manufacturing processes to form the source and drain regions may also be employed to form the isolation structure between a source/drain region and an adjacent gate.

Moreover, some embodiments of a manufacturing process according to the principles of the present invention may actually reduce the number of process steps required for the manufacturing process. For example, some embodiments may use the modified gate formation steps and source/drain implant steps to replace the localized oxidation (LOCOS) or other trench isolation structures typically formed in conventional semiconductor device manufacturing processes. In fact, the self-aligned nature of the isolation structure and mask can be smaller that conventional shallow trench isolation (STI) because existing processing techniques enable better definition during gate formation than during trench formation. Those skilled in the art understand that, in terms of processing technology, forming a gate is much more sophisticated than forming trench isolation, such that a very fine line can be formed with gate formation procedures, whereas the STI is more crude and may not be self-aligned with any of the semiconductor device features.

Figure 9:
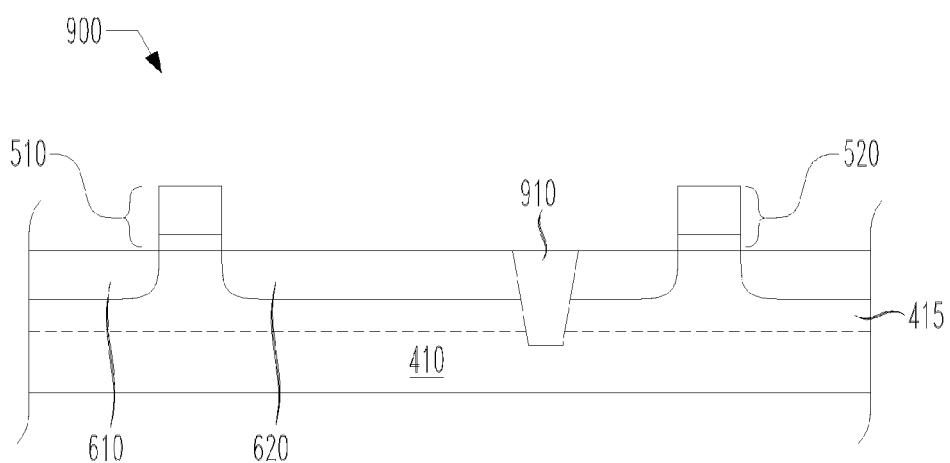
FIG. 9 illustrates a sectional view of another embodiment of an integrated circuit device constructed according to the principles of the present invention.

However, the STI processes is not without its advantages, as described below. Turning briefly to FIG. 9, illustrated is a sectional view of another embodiment of a semiconductor device 900 constructed according to the principles of the present invention. The particular embodiment shown in FIG. 9 is substantially similar to the embodiment shown in FIGS. 1-3, except that the serpentine-shaped mask 250 and isolation structure 240 have been replaced by a serpentine (or otherwise) shaped shallow trench isolation 910. Those skilled in the art understand how a shallow trench isolation may be formed. The serpentine shaped shallow trench isolation 910 may substantially comprise a dielectric material (an oxide). Accordingly, the shallow trench isolation 910 may be non-conductive, rather than merely having a lower conductivity than the surrounding areas of the substrate 410. Moreover, as discussed above, many existing integrated circuit devices have manufacturing process that include shallow trench isolation formation steps, such that the embodiment shown in FIG. 9 may also be integrated into existing technologies without adding any process steps.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:

forming a gate over a semiconductor substrate;

forming a source/drain region in said semiconductor substrate, said source/drain region located adjacent said gate; and forming an isolation structure in said semiconductor substrate, said isolation structure forming a continuous boundary around said source/drain region except for a constricted current passage in said continuous boundary, said constricted current passage located between said gate and said source/drain region.

2. The method of manufacturing a semiconductor device as recited in claim 1 wherein said isolation structure has a serpentine contour.

3. The method of manufacturing a semiconductor device as recited in claim 1 wherein said forming said isolation structure includes forming a mask over said semiconductor substrate and implanting dopant into said semiconductor substrate around said mask to form said source/drain region.

4. The method of manufacturing a semiconductor device as recited in claim 3 wherein said forming said mask occurs simultaneously with said forming said gate.

5. The method of manufacturing a semiconductor device as recited in claim 1 wherein said forming said isolation structure includes forming a portion of said semiconductor substrate having decreased conductivity relative to said source/drain region.

6. The method of manufacturing a semiconductor device as recited in claim 1 wherein said forming said isolation structure includes forming a shallow trench isolation in said semiconductor substrate.

7. The method of manufacturing a semiconductor device as recited in claim 1 wherein said forming said gate includes forming first and second gates separated by a region comprising said isolation structure and said source/drain region.

8. The method of manufacturing a semiconductor device as recited in claim 1 wherein said semiconductor substrate is doped with a first dopant type and said forming said source/drain region includes implanting a second dopant type that is opposite said first dopant type.

* * * * *